United States Patent
Brand

(10) Patent No.: US 7,306,974 B2
(45) Date of Patent: Dec. 11, 2007

(54) MICROELECTRONIC DEVICES AND METHODS FOR MANUFACTURING AND OPERATING PACKAGED MICROELECTRONIC DEVICE ASSEMBLIES

(75) Inventor: Joseph M. Brand, Boise, ID (US)

(73) Assignee: Micron Technology, Inc., Boise, ID (US)

(*) Notice: Subject to any disclaimer, the term of this patent is extended or adjusted under 35 U.S.C. 154(b) by 287 days.

(21) Appl. No.: 11/206,012

(22) Filed: Aug. 16, 2005

(65) Prior Publication Data
US 2006/0040422 A1    Feb. 23, 2006

Related U.S. Application Data

(62) Division of application No. 10/215,509, filed on Aug. 8, 2002, now Pat. No. 7,067,905.

(51) Int. Cl.
H01L 21/66 (2006.01)

(52) U.S. Cl. ............. 438/112; 257/E21.506

(58) Field of Classification Search ........ 438/106–118, 438/123–128, 121, 14–16, 33, 464, 60, 612, 438/617, 660, 673, 689, 773
See application file for complete search history.

(56) References Cited

U.S. PATENT DOCUMENTS

| | | | |
|---|---|---|---|
| 5,057,457 A | 10/1991 | Miyahara et al. | |
| 5,343,074 A | 8/1994 | Higgins, III et al. | |
| 5,394,010 A | 2/1995 | Tazawa et al. | |
| 5,406,117 A | 4/1995 | Dlugokecki et al. | |
| 5,430,331 A | 7/1995 | Hamzehdoost et al. | |
| 5,593,927 A | 1/1997 | Farnworth et al. | |
| 5,677,566 A | 10/1997 | King et al. | |
| 5,696,033 A | 12/1997 | Kinsman | |
| 5,698,899 A | 12/1997 | Hirakawa et al. | |
| 5,739,585 A | 4/1998 | Akram et al. | |
| 5,750,421 A * | 5/1998 | Kasai et al. | 438/106 |
| D394,844 S | 6/1998 | Farnworth et al. | |

(Continued)

FOREIGN PATENT DOCUMENTS

JP    63141353    6/1988

(Continued)

*Primary Examiner*—Michael Lebentritt
*Assistant Examiner*—Andre' Stevenson
(74) *Attorney, Agent, or Firm*—Perkins Coie LLP

(57) ABSTRACT

Packaged microelectronic devices, methods for packaging microelectronic devices, and methods of operating microelectronic devices. In one embodiment, a packaged microelectronic device comprises a die including integrated circuitry, a first casing coating at least a portion of the die, a heat sink proximate to the die, and a second casing on at least a portion of the heat sink and coating at least a portion of the first casing. The first casing has a plurality of first interconnect elements, and the second casing engages the first interconnect elements to the first casing. The interconnect elements can be surface striations or other features that project into or away from the first casing. For example, the interconnect elements can be ridges extending across a surface of the first casing. In other embodiments, the first interconnect elements can be bumps and/or dimples across the surface of the first casing. The second casing can be molded around the first casing such that the material of the second casing conforms to or otherwise engages the first interconnect elements.

9 Claims, 4 Drawing Sheets

U.S. PATENT DOCUMENTS

| | | |
|---|---|---|
| 5,804,468 A | 9/1998 | Tsuji et al. |
| D402,638 S | 12/1998 | Farnworth et al. |
| 5,851,845 A | 12/1998 | Wood et al. |
| 5,879,965 A | 3/1999 | Jiang et al. |
| 5,891,753 A | 4/1999 | Akram |
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,133,068 A | 10/2000 | Kinsman |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,184,465 B1 | 2/2001 | Corisis |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,229,202 B1 | 5/2001 | Corisis |
| 6,239,487 B1 | 5/2001 | Park et al. |
| 6,246,108 B1 | 6/2001 | Corisis et al. |
| 6,246,110 B1 | 6/2001 | Kinsman et al. |
| 6,258,624 B1 | 7/2001 | Corisis |
| 6,259,153 B1 | 7/2001 | Corisis |
| 6,261,865 B1 | 7/2001 | Akram |
| 6,277,671 B1 | 8/2001 | Tripard |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,705 B1 | 12/2001 | Ahmad |
| 6,331,221 B1 | 12/2001 | Cobbley |
| 6,331,448 B1 | 12/2001 | Ahmad |
| 6,331,453 B1 | 12/2001 | Bolken et al. |
| 6,332,766 B1 | 12/2001 | Thummel |
| 6,344,976 B1 | 2/2002 | Schoenfeld et al. |
| 6,355,985 B1 | 3/2002 | Brand |
| 6,383,841 B2 * | 5/2002 | Li .................. 438/112 |
| 6,506,629 B1 | 1/2003 | Kinsman et al. |
| 6,589,820 B1 | 7/2003 | Bolken |
| 6,706,565 B2 | 3/2004 | Brand |
| 2002/0119598 A1 * | 8/2002 | Kawata et al. ............. 438/107 |
| 2003/0228720 A1 * | 12/2003 | Ito et al. .................... 438/124 |
| 2004/0026776 A1 | 2/2004 | Brand |

FOREIGN PATENT DOCUMENTS

| | | |
|---|---|---|
| JP | 01220465 | 9/1989 |
| JP | 04092459 | 3/1992 |
| KR | 2001008825 | 2/2001 |

* cited by examiner

MICROELECTRONIC DEVICES AND METHODS FOR MANUFACTURING AND OPERATING PACKAGED MICROELECTRONIC DEVICE ASSEMBLIES

CROSS-REFERENCE TO RELATED APPLICATION

This application is a divisional of U.S. patent application Ser. No. 10/215,509 filed Aug. 8, 2002 now U.S. Pat. No. 7,067,905, which is incorporated herein by reference in its entirety.

TECHNICAL FIELD

The present invention relates to methods and apparatus for packaging microelectronic devices and, in particular, to methods for encapsulating microelectronic dies in the manufacturing of memory devices, microprocessors and other types of microelectronic devices.

BACKGROUND

Microelectronic devices are generally complex, delicate components used in larger products. A typical microelectronic device includes a microelectronic die, a support structure attached to the die, and a protective casing encapsulating the die. The microelectronic die can be a semiconductor device (e.g., a microprocessor or a memory device), a field emission display, or another type of device. The support structure is generally a lead frame having a plurality of leads or an interposing substrate having electrically conductive traces and solder ball pads. The protective casing is generally a hard plastic, such as a thermosetting material, that is molded around the die. The protective casing encapsulates the die and a portion of the support structure to protect the die from environmental hazards and physical shocks.

The microelectronic dies include integrated circuitry and a plurality of bond-pads that are coupled to the integrated circuitry. In a typical application for a DRAM memory device, a die will have a reference voltage ($V_{ref}$) bond-pad, a plurality of supply voltage ($V_{dd}$) and ground voltage ($V_{ss}$) bond-pads, a plurality of signal bond-pads (e.g., clock lines, address lines, and data lines), a column address strobe (CAS) bond-pad, and a row address strobe (RAS) pad. The bond-pads are often arranged in a fine pitch array on one side of the die, and each bond-pad is coupled to the appropriate voltage source or signal source. For example, the $V_{ref}$ bond-pad is coupled to a reference voltage source, the $V_{ss}$ and $V_{dd}$ bond-pads are coupled to appropriate electrical potentials, and the signal bond-pads are coupled to the correct signal sources. The support structures are accordingly configured so that the leads or traces couple the bond-pads on the die to the corresponding voltage and signal sources.

The trend in microchip fabrication is to manufacture smaller and faster microelectronic dies for computers, cell phones, PDAs, and many other products. As the dies become faster and have larger capacities, the components of the integrated circuitry are much smaller and spaced closer together so that more components can be fabricated in the dies. The high densities of components and fast operating speeds increase the amount of heat produced by the dies. High performance microelectronic devices accordingly generate a significant amount of heat during operation.

A significant limiting factor for operating packaged microelectronic devices is dissipating the heat generated by high performance dies. The dies are sensitive components that are typically protected from physical contact and environmental conditions to avoid damaging the die. In many applications, the protective casings seal the die from environmental factors (e.g., moisture) and shield the die from electrical and mechanical shocks. The protective casings, however, also retain the heat generated by the dies. This may cause high performance dies to overheat to the extent that the dies malfunction or are damaged.

One conventional technique to dissipate the heat from packaged devices is to bond a heat sink to an external surface of the casing encapsulating a die. The heat sink is typically attached to the casing using an epoxy or other adhesive. One drawback of this is that the heat generated by high performance dies may raise the temperature of the epoxy to a level at which it fails. Therefore, existing packaged microelectronic devices with heat sinks do not provide adequate solutions for operating high performance dies.

SUMMARY

The present invention is directed toward packaged microelectronic devices, methods for packaging microelectronic devices, and methods of operating microelectronic devices. In one embodiment, a packaged microelectronic device comprises a die including integrated circuitry, a first casing coating at least a portion of the die, a heat sink proximate to the die, and a second casing on at least a portion of the heat sink and coating at least a portion of the first casing. The first casing has a plurality of first interconnect elements, and the second casing engages the first interconnect elements to the first casing. The interconnect elements can be surface striations or other features that project into or away from the first casing. For example, the interconnect elements can be ridges extending across a surface of the first casing. In other embodiments, the first interconnect elements can be bumps and/or dimples across the surface of the first casing. The second casing can be molded around the first casing such that the material of the second casing conforms to or otherwise mates with the first interconnect elements.

Another embodiment of a packaged microelectronic device comprises a die including integrated circuitry, a first molded casing covering at least a portion of the die, a heat dissipation unit carried by one of the die and the first casing, and a second molded casing encapsulating at least a portion of the heat dissipation unit and at least a portion of the first casing. The first casing includes a plurality of first coupling elements, and the second casing includes a plurality of second coupling elements interconnected with corresponding first coupling elements of the first casing. The second coupling element, for example, can be molded to mate with the first coupling elements.

Another embodiment of a packaged microelectronic device comprises a semiconductor die comprising integrated circuitry and a plurality of bond-pads that form a memory device, a distribution member having a plurality of contacts electrically coupled to the bond-pads, a first casing enclosing at least a portion of the die, and a second casing enclosing at least a portion of the first casing. The first casing can further include a plurality of engagement elements on an outer surface of the first casing, and the second casing can include mating elements that engage the engagement elements of the first casing. In each of the foregoing embodiments, the interconnect elements, coupling elements, or engagement elements enhance the bond between the first casing and the second casing to inhibit delamination between the casings.

Other aspects of the present invention are directed toward methods for fabricating microelectronic devices. In one embodiment, a method of manufacturing a microelectronic device includes forming a first casing to cover at least a portion of a die having an integrated circuit. The method also includes covering a portion of the first casing with a second casing. The act of forming a first casing further includes forming a plurality of interconnecting elements on the outer surface of the first casing. The act of covering a portion of the first casing with the second casing further includes engaging a portion of the second casing with the interconnect elements of the first casing.

Another embodiment of a method for manufacturing a microelectronic device includes providing a die having an integrated circuit, encasing at least a portion of the die with a first casing, positioning a heat sink proximate to the die, and covering at least a portion of the first casing and the heat sink with a second casing. The first casing includes coupling elements, and the second casing includes mating elements that engage corresponding coupling elements.

Still another embodiment of a method for manufacturing a microelectronic device comprises providing a die having integrated circuitry that defines a memory device and a plurality of bond-pads coupled to the integrated circuitry. This embodiment also includes attaching the die to a distribution member having a plurality of electrical connectors, and electrically coupling the bond-pads on the die to corresponding electrical connectors on the distribution member. This method continues by molding a first casing to enclose at least a portion of the die and the distribution member; positioning a heat dissipation unit proximate to at least one of the die, the distribution member, and/or the first casing; and molding a second casing to enclose at least a portion of the first casing and the heat dissipation unit. The first casing is molded to include a coupling member on the first casing, and the second casing is molded so that the second casing engages the coupling member of the first casing.

DETAILED DESCRIPTION

The present invention is directed toward microelectronic device assemblies, methods for manufacturing microelectronic devices, and methods for operating microelectronic device assemblies. The term "microelectronic device" is used throughout to include devices that have integrated circuits, such as processors, memory devices, field emission displays, and many other types of devices. Thus, even though several embodiments of the present invention are described with respect to memory devices, the methods and apparatus are also applicable to other types of microelectronic devices. Additionally, although the following embodiments of the invention described with reference to FIGS. 1-6 disclose microelectronic devices that have a die mounted on a lead frame, the invention is also applicable to other devices in which a die is mounted on an interposer substrate, such as board-on-chip, chip-on-board, and flip-chip packages. One skilled in the art will accordingly understand that the present invention may have other embodiments in addition to those disclosed below and that such additional embodiments of the invention may be practiced with additional feature or without several elements of the embodiments shown in FIGS. 1-6.

Figure 1:
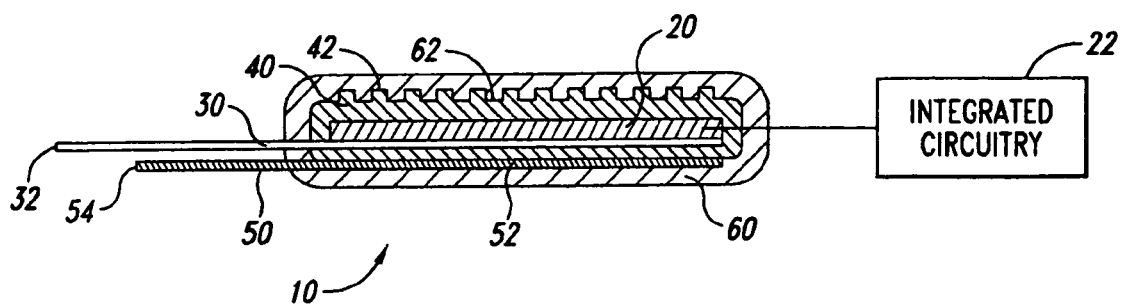
FIG. 1 is a schematic cross-sectional view of a microelectronic device in accordance with an embodiment of the invention.

FIG. 1 is a schematic cross-sectional view of a microelectronic device 10 in accordance with an embodiment of the invention. The microelectronic device 10 includes a die 20 that has integrated circuitry 22. The integrated circuitry 22 can form a memory device, such as a DRAM, SRAM, RDRAM, or other type of memory. The integrated circuitry 22 can alternatively form a processor, amplifier, resonator, or other type of microelectronic device. In general, the integrated circuitry includes a large number of very small sub-micron components, such as transistors, conductive lines, contacts, and many other components. The embodiment of the microelectronic device 10 shown in FIG. 1 also includes a distribution member 30 having a plurality of contacts 32. The die 20 is mounted to the distribution member 30 so that the contacts 32 are electrically coupled to the integrated circuitry. For example, the die 20 typically includes a plurality of bond-pads (not shown) that can be wire-bonded to the contacts 32 using techniques known in the art. It will be appreciated that the bond-pad on the die 20 can also be coupled to the contacts 32 using flip-chip techniques known in the art. The distribution member 30 can accordingly be a metal lead frame or an interposer substrate with printed circuitry and ball-pads for a ball-grid array. Suitable configurations that use a lead frame or interposer substrate are disclosed in U.S. Pat. No. 6,355,985B1 and U.S. application Ser. No. 09/595,623, which are incorporated herein by reference.

Figure 2:
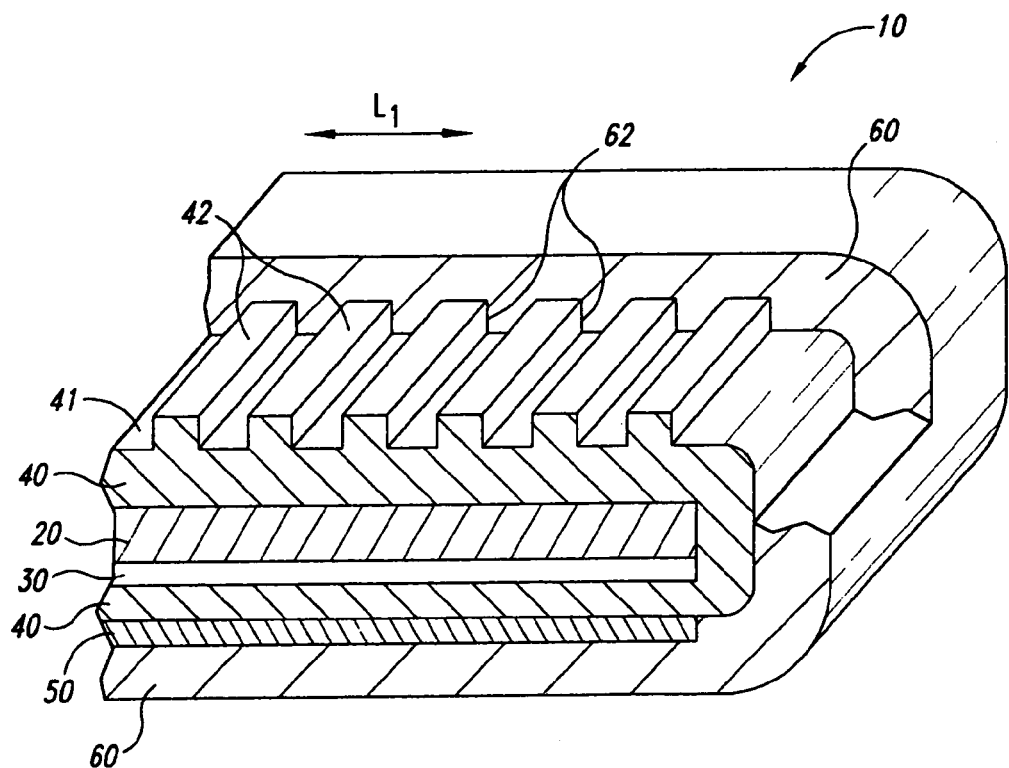
FIG. 2 is a schematic cross-sectional view that isometrically illustrates a portion of the microelectronic device of FIG. 1.

FIG. 2 is a schematic cross-sectional view that isometrically illustrates a portion of the microelectronic device 10 of FIG. 1 in greater detail. Referring to FIGS. 1 and 2 together, the microelectronic device 10 can further include a first casing 40, a heat dissipation unit 50, and a second casing 60. The first casing 40 covers or otherwise coats at least a portion of the die 20. The first casing 40, for example, can be molded using injection molding techniques and compounds known in the art of packaging microelectronic devices. In the embodiment shown in FIG. 1, the first casing 40 is molded to completely encapsulate or otherwise enclose the die 20. The contacts 32 of the distribution member 30 are not encapsulated by the first casing 40. The contacts 32 can accordingly be coupled to signal lines and voltage sources.

The first casing 40 has an outer surface 41 and a plurality of coupling elements 42. The coupling elements 42 can be features that project into or away from the outer surface 41. The coupling elements 42 are preferably surface features of the first casing 40 that provide interconnecting elements or engaging elements for securing the second casing 60 to the first casing 40. In the embodiment shown in FIGS. 1 and 2, the first coupling elements 42 are ridges or striations extending across the outer surface 41 of the first casing 40. The first coupling elements 42 can have several different configurations, and some additional configurations are described below with reference to FIGS. 3A-3E.

The heat dissipation unit 50 is carried by one of the die 20, the first casing 40, and/or the second casing 60. The heat dissipation unit 50 is typically a thermally conductive member, such as a metal frame or panel, that draws heat away from the die 20 and the first casing 40. The heat dissipation unit 50 can include a main panel 52 (FIG. 1) and a plurality of leads 54 (FIG. 1). In the embodiment shown in FIGS. 1 and 2, the main panel 52 is attached to the outer surface of the first casing 40, and the leads 54 extend outwardly beyond the first casing 40. The leads 54 can be coupled to a cooling unit to continually draw heat away from the first casing 40. The heat dissipation unit 50 is accordingly a heat sink positioned proximate to the die 20 for dissipating heat generated by the integrated circuitry 22 in the die 20.

The second casing 60 encapsulates at least a portion of the heat dissipation unit 50 and the first casing 40. In the embodiment shown in FIGS. 1 and 2, the second casing 60 completely encapsulates the first casing 40 and the main panel 52 of the heat dissipation unit 50. The second casing 60 can be molded around the first casing 40 such that the second casing engages the first coupling elements 42. The molding process can accordingly form a plurality of second coupling elements 62 in the second casing 60. The second coupling elements 62 generally mate with or otherwise engage the first coupling elements 42. In other embodiments, the second casing 60 is molded around only a portion of the first casing 40 and a portion of the main panel 52.

The first casing 40 and the second casing 60 can be formed from molding compounds used in injection molding processes for encapsulating microelectronic dies. Many suitable molding compounds are known in the art. In a typical application, the first casing 40 and the second casing 60 can be molded from the same compound. In other applications, the first casing 40 and the second casing 60 are molded from different compounds.

The microelectronic device 10 shown in FIGS. 1 and 2 can be manufactured by first attaching the die 20 to the distribution member 30 and then electrically coupling bond-pads on the die 20 to the connectors 32 (FIG. 1) of the distribution member 30 using wire-bonding or flip-chip techniques known in the art. The assembly of the die 20 and the distribution member 30 is then placed in a first injection mold that is configured to form the first coupling elements 42. Suitable injection molding techniques for lead frame devices or devices having interposing substrates are disclosed in U.S. Pat. No. 6,355,985B1 and U.S. application Ser. No. 09/595,623, which are incorporated in their entirety by reference above. The heat dissipation unit 50 is then attached to the outer surface 41 of the first casing 40. After attaching the heat dissipation unit 50 to the first casing 40, the second casing 60 is molded around the first casing 40 and the heat dissipation member 50. The second casing 60 can be molded by placing the assembly of the die 20, the distribution member 30, the first casing 40, and the heat dissipation unit 50 in a second mold. A molding compound is then injected into the second mold. After molding the second casing 60, the microelectronic device 10 can be processed in a final procedure in which the contacts 32 and the lead 54 are cut and/or bent into a desired configuration.

The particular embodiment of the microelectronic device 10 shown in FIGS. 1 and 2 is expected to inhibit or otherwise prevent delamination between the first casing 40 and the second casing 60. One concern of manufacturing a device with two casings is that the packaged device is subject to high temperature procedures that may affect the bond between the first casing 40 and the second casing 60. For example, burn-in processes or reflow processes may cause the second casing 60 to delaminate from the first casing 40. The coupling elements 42 and 62 in the embodiment of the microelectronic device 10 are expected to inhibit such delamination. The first coupling elements 42 and the second coupling elements 62 increase the surface area over which the first casing 40 interfaces with the second casing 60. Such an increase in surface area is expected to enhance the bond between the two casings. Additionally, the interface between the first coupling elements 42 and the second coupling elements 62 prevents relative movement between the first casing 40 and the second casing 60 laterally in a direction indicated by arrow $L_1$ (FIG. 2). Therefore, the embodiment of the microelectronic die 10 shown in FIGS. 1 and 2 is expected to be less susceptible to being damaged because of delamination or other irregularities in the first casing 40 and the second casing 60.

Figure 3A:
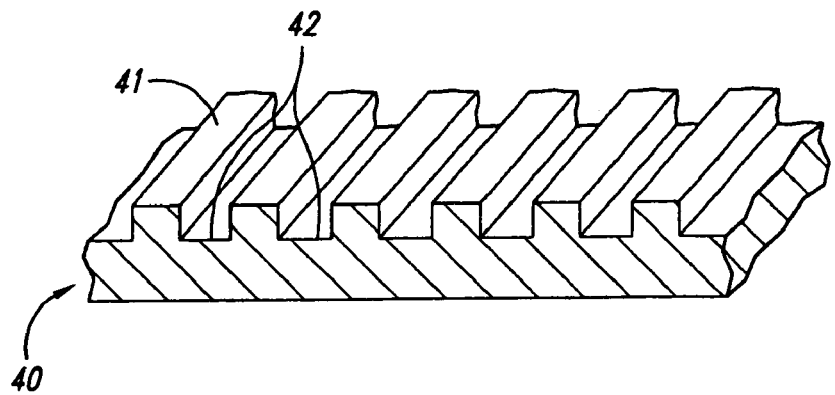
FIGS. 3A-3E are schematic cross-sectional views of first casings for use in microelectronic devices in accordance with various embodiments of the invention.
Figure 3B:
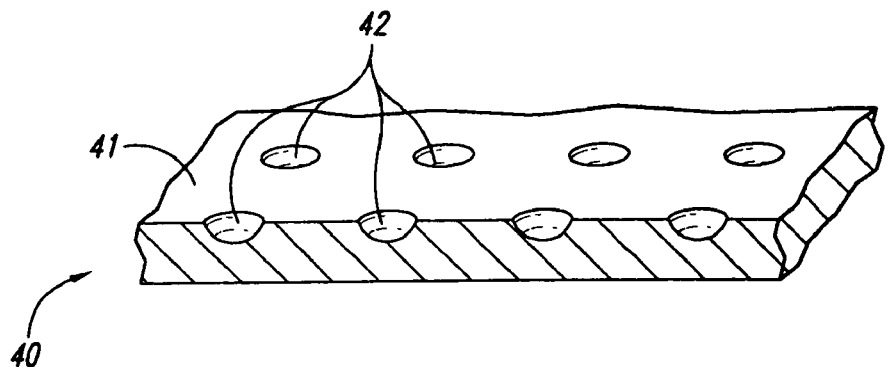
Figure 3C:
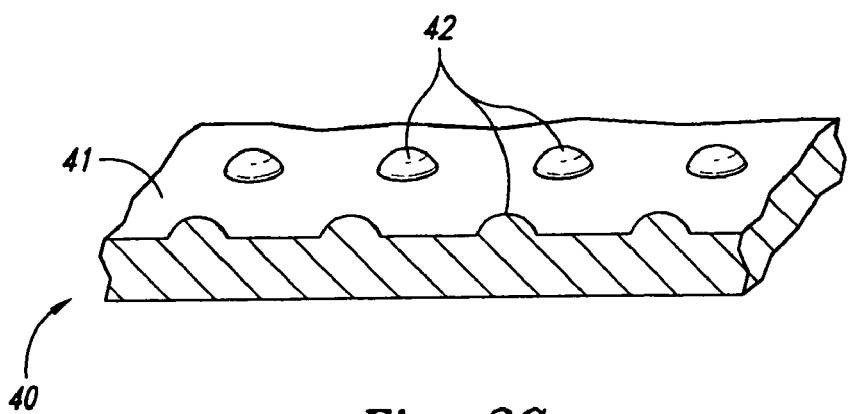
Figure 3D:
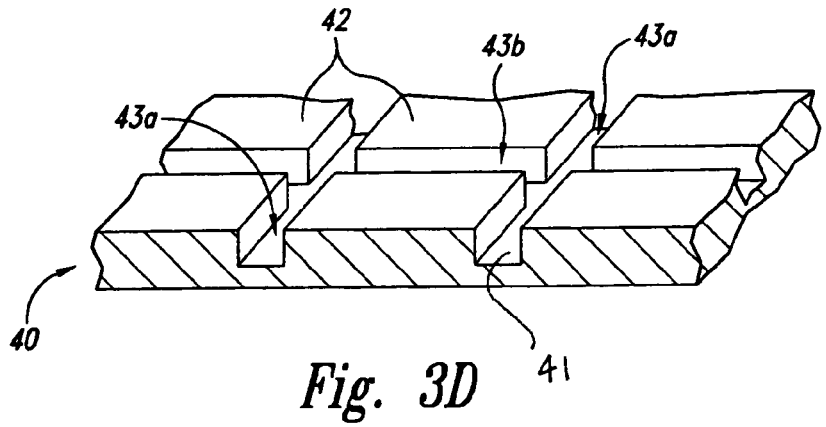
Figure 3E:
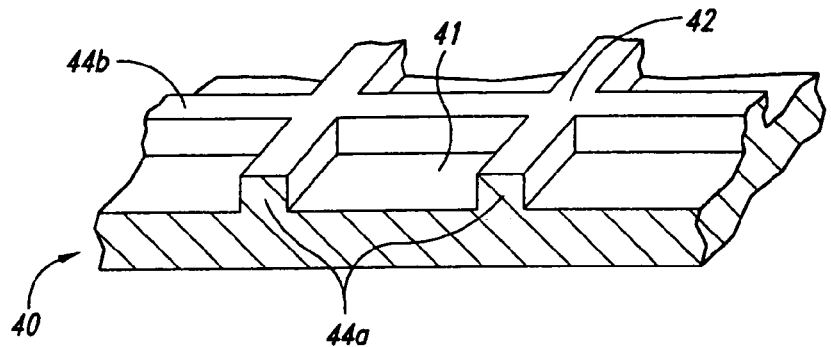

FIGS. 3A-3E are schematic cross-sectional views illustrating a portion of a number of different embodiments of the first casing 40. Referring to FIG. 3A, the first casing 40 in this embodiment has an outer surface 41 and a plurality of coupling elements 42 defined by channels that project inwardly from the outer surface 41. FIG. 3B illustrates an embodiment of the first casing 40 in which the coupling elements 42 are dimples or other types of depressions that project inwardly from the outer surface 41. FIG. 3C illustrates an embodiment of the first casing 40 in which the first coupling elements 42 are mounds or other types of protuberances that project outwardly from the outer surface 41. FIG. 3D illustrates an embodiment of the first casing 40 in which the first coupling elements 42 are raised lands that project outwardly relative to the outer surface 41. The lands 42 are configured to define a plurality of first channels 43a that extend in one direction and a plurality of second channels 43b that extend in a direction transverse to the first channels 43a. FIG. 3E illustrates another embodiment of the first section 40 having a first coupling element 42 including a plurality of first sections 44a extending in one direction and a plurality of second sections 44b extending transversely to the first sections 44a. The first and second sections 44a-b of the first coupling element 42 can be first and second ridges that project away from the outer surface 41. It will be appreciated that the second casing 60 is molded around the first casing 40 so that the second casing 60 has mating elements that conform to the contour of any of the coupling elements 42 illustrated in FIGS. 3A-3E. Therefore, the embodiments of the first casings 40 shown in FIGS. 3A-3E are expected to perform in a manner similar to that described above with reference to FIGS. 1 and 2.

Figure 4:
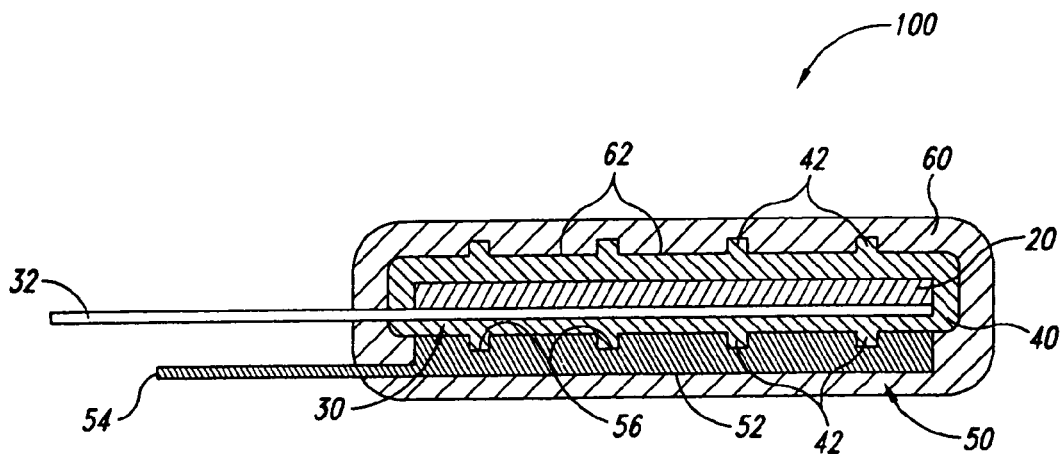
FIG. 4 is a schematic cross-sectional view of a microelectronic device in accordance with another embodiment of the invention.

FIG. 4 is a schematic cross-sectional view of a microelectronic device 100 in accordance with another embodiment of the invention. Like reference numbers refer to like components in FIGS. 1-4. The microelectronic device 100 includes a first casing 40 having a first side, a second side, and first coupling elements 42 on both the first and second sides. The heat dissipation unit 50 accordingly includes receiving members 56 that receive the first coupling elements 42 on the second side of the casing. The receiving members 56 can be channels corresponding to elongated ridges on the first casing 40. The interface between the first coupling elements 42 and the receiving members 56 is expected to enhance the bond between the first casing 40 and the heat dissipation unit 50. Additionally, the increased surface area between the first casing 40 and the heat dissipation unit 50 is also expected to enhance the heat transfer rate between the die 20 and the heat dissipation unit 50.

Figure 5:
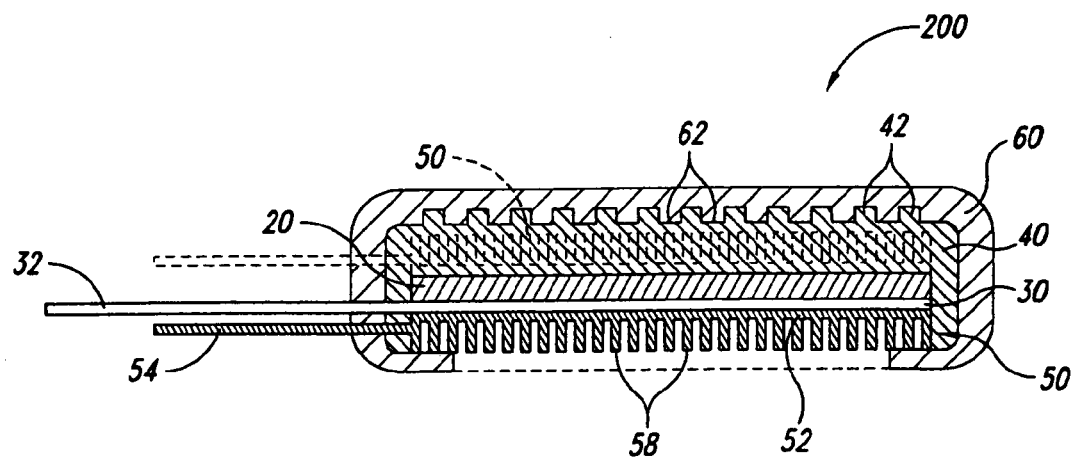
FIG. 5 is a schematic cross-sectional view of a microelectronic device in accordance with yet another embodiment of the invention.

FIG. 5 is a schematic cross-sectional view of a microelectronic device 200 in accordance with yet another embodiment of the invention. Like-reference numbers refer to like components in FIGS. 1-5. In the microelectronic device 200, the heat dissipation unit 50 is mounted directly to the distribution member 30. It will be appreciated that the heat dissipation unit 50 can alternatively be mounted to the backside of the die 20 (shown in broken lines). In this embodiment, the heat dissipation unit 50 includes a plurality of flanges 58, and the first casing 40 covers the die 20 and a side portion of the heat dissipation unit 50. The second casing 60 covers the first casing 40 and a portion of the flanges 58 of the heat dissipation unit 50. Accordingly, the remainder of the flanges 58 of the heat dissipation unit 50 are exposed to enhance the cooling effect of the heat dissipation unit 50. It will be appreciated that the second casing 60 can completely encapsulate the flanges 58 of the heat dissipation unit 50 (shown in broken lines) in a different embodiment.

Figure 6:
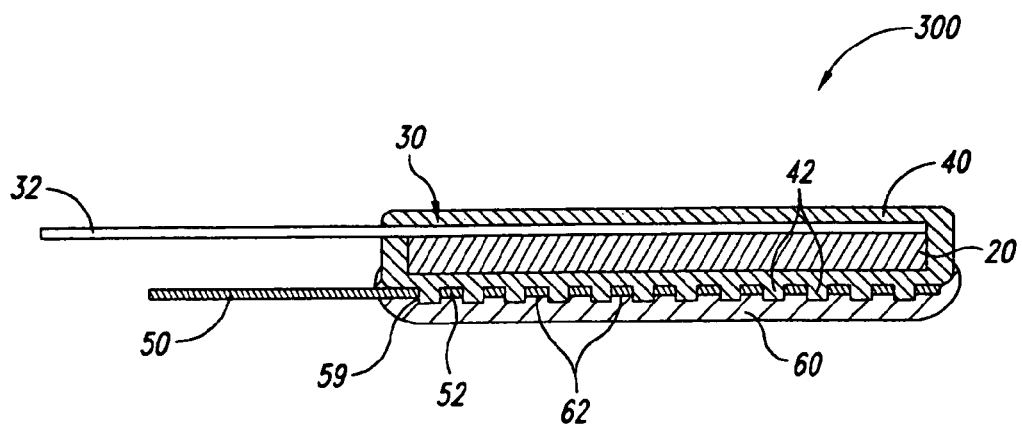
FIG. 6 is a schematic cross-sectional view of a microelectronic device in accordance with still another embodiment of the invention.

FIG. 6 is a schematic cross-sectional view of a microelectronic device 300 in accordance with still another embodiment of the invention. Like reference numbers refer to like components in FIGS. 1-6. In this embodiment, the microelectronic device 300 includes a heat dissipation unit 50 having a plurality of slots 59 that receive the first coupling elements 42 of the first casing 40. The second casing 60 covers only a portion of the first casing 40 to encapsulate the main panel 52 of the heat dissipation unit 50 and the first coupling elements 42 of the first casing 40. The second casing 60 conforms to the portion of the first coupling elements 42 that project through the slots 59. The second casing 60 accordingly includes a plurality of the second coupling elements 62 that are interconnected with corresponding first coupling elements 42.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of manufacturing a microelectronic device having a die including an integrated circuit, comprising:
   injection molding a first casing to have an outer surface and a plurality of first elongated interconnecting elements extending across the outer surface and projecting into and/or away from the outer surface, wherein the first casing covers at least a portion of the die; and
   covering a portion of the first casing with a second casing that has second elongated interconnecting elements engaged with the first elongated interconnecting elements of the first casing.

2. The method of claim 1 wherein:
   forming the first casing comprises molding a first cover to have an outer surface and a plurality of elongated ridges extending across the outer surface that define the first elongated interconnecting elements; and
   covering the first casing with the second casing comprises molding a second cover around at least a portion of the first cover, wherein the second cover has channels that defined the second elongated interconnecting elements.

3. The method of claim 1 wherein:
   forming the first casing comprises molding a first cover to have an outer surface and a plurality of channels across the outer surface that define the first elongated interconnecting elements; and
   covering the first casing with the second casing comprises molding a second cover around at least a portion of the first cover, wherein the second cover has elongated ridges that define the second elongated interconnecting elements.

4. The method of claim 1 wherein:
   forming the first casing comprises molding a first cover to have an outer surface and a plurality of lands across the outer, the lands being separated by first channels extending in a first direction and second channels extending in a second direction transverse to the first direction, and wherein the first and second channels define the first elongated interconnecting elements; and
   covering the first casing with the second casing comprises molding a second cover around at least a portion of the first cover, wherein the second cover conforms to the lands and has ridges in the first and second channels that define the second elongated interconnecting elements.

5. A method of manufacturing a microelectronic device, comprising:
   providing a die having an integrated circuit;
   encasing at least a portion of the die with an injection molding compound forming a first casing having an elongated coupling element extending across an outer surface of the casing and projecting into and/or away from the outer surface;
   positioning a heat sink proximate to the die; and
   covering at least a portion of the first casing and the heat sink with a second casing having an elongated mating element engaging the elongated coupling element.

6. The method of claim 5 wherein:
   encasing at least a portion of the die with the first casing comprises molding a first cover to have an outer surface and a plurality of elongated ridges extending across the outer surface that define elongated coupling elements; and
   covering the first casing with the second casing comprises molding a second cover around at least a portion of the first cover, wherein the second cover has channels defining elongated mating elements that receive the elongated ridges.

7. The method of claim 5 wherein:
   encasing at least a portion of the die with the first casing comprises molding a first cover to have an outer surface and a plurality of channels across the outer surface that define elongated coupling elements; and
   covering the first casing with the second casing comprises molding a second cover around at least a portion of the first cover, wherein the second cover has elongated mating elements defined by elongated ridges received in the channels of the first casings.

8. The method of claim 5 wherein:
   encasing at least a portion of the die with the first casing comprises molding a first cover to have an outer surface and a plurality of lands across the outer surface, the lands being separated by first channels extending a first direction and second channels extending in a second direction transverse to the first direction, wherein the first and second channels define elongated coupling elements; and covering the first casing with the second casing comprises molding a second cover around at least a portion of the first cover, wherein the second cover conforms to the lands and has ridges in the first and second channels that define the elongated mating elements.

9. A method of manufacturing a microelectronic device, comprising:

provid ing a die having integrated circuitry forming a memory device and a plurality of bond-pads coupled to the integrated circuitry;

attaching the die to a distribution member having a plurality of electrical connectors, the bond-pads being electrically coupled to corresponding electrical connectors;

molding a first casing to enclose at least a portion of the die and the distribution member, wherein molding the first casing further includes forming a coupling member on the first casing;

positioning a heat dissipation unit proximate to at least one of the die, the distribution member, and/or the first casing; and molding a second casing to enclose at least a portion of the first casing and the heat dissipation unit, wherein the second casing engages the coupling member.

* * * * *